(12) United States Patent
Zhu

(10) Patent No.: US 10,886,652 B2
(45) Date of Patent: Jan. 5, 2021

(54) FPC CONNECTOR, TOUCH-SENSITIVE SCREEN AND LCD SCREEN

(71) Applicant: Shenzhen Startek Electronic Technology Co., Ltd., Shenzhen (CN)

(72) Inventor: Dejun Zhu, Shenzhen (CN)

(73) Assignee: SHENZHEN STARTEK ELECTRONIC TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/086,002

(22) PCT Filed: Mar. 23, 2018

(86) PCT No.: PCT/CN2018/080127
§ 371 (c)(1),
(2) Date: Sep. 17, 2018

(87) PCT Pub. No.: WO2018/153383
PCT Pub. Date: Aug. 30, 2018

(65) Prior Publication Data
US 2020/0099151 A1 Mar. 26, 2020

(30) Foreign Application Priority Data
Feb. 27, 2017 (CN) .................... 2017 2 0178982 U

(51) Int. Cl.
*H01R 13/02* (2006.01)
*G06F 3/0488* (2013.01)
(Continued)

(52) U.S. Cl.
CPC ......... *H01R 13/025* (2013.01); *G06F 3/0488* (2013.01); *H01R 12/7076* (2013.01); *H01R 13/03* (2013.01)

(58) Field of Classification Search
CPC .. H01R 13/025; H01R 12/7076; H01R 13/03; H01R 12/77; G06F 3/0488;
(Continued)

(56) References Cited

U.S. PATENT DOCUMENTS 9,052,768 B2 * 6/2015 Kurasawa .............. G09G 5/006
10,129,978 B2 * 11/2018 Ishida .................... H05K 1/111
(Continued)

FOREIGN PATENT DOCUMENTS

CN 1781347 A 5/2006
CN 102883539 A 1/2013
(Continued)

OTHER PUBLICATIONS

International Search Report for PCT/CN2018/080127.
International Publication for PCT/CN2018/080127.

*Primary Examiner* — Nguyen Tran
*Assistant Examiner* — Paul D Baillargeon

(57) ABSTRACT

The present application relates to an FPC connector, comprising a first insulating layer, a first circuit layer comprising a plurality of conductive strips, and a second insulating layer, wherein the first circuit layer and the second insulating layer each has a forepart extending beyond a front end of the first insulating layer; the first circuit layer comprises a plurality of conductive strips having foreparts arranged in parallel at equal intervals, a metal layer is plated with or deposited on the foreparts of the first circuit layer, the metal layer and the foreparts of the first circuit layer constitute metal fingers; conductive strips on other circuit layers connect to the conductive strips of the layer by vias and metallic coating or deposition. A position located at a bottom of the FPC corresponding to the metal fingers is covered by a layer of reinforcing plate.

20 Claims, 2 Drawing Sheets

(51) Int. Cl.
*H01R 12/70* (2011.01)
*H01R 13/03* (2006.01)
(58) Field of Classification Search
CPC ...... H05K 1/0298; H05K 1/114; H05K 1/117; H05K 1/112; H05K 3/4069
See application file for complete search history.

(56) References Cited

U.S. PATENT DOCUMENTS

| | | | |
|---|---|---|---|
| 2004/0156583 A1* | 8/2004 | Totani | H05K 3/361 |
| | | | 385/24 |
| 2012/0132458 A1* | 5/2012 | Sekine | H05K 1/0393 |
| | | | 174/254 |
| 2017/0181282 A1* | 6/2017 | Ishida | H05K 1/144 |

FOREIGN PATENT DOCUMENTS

| | | |
|---|---|---|
| CN | 202841706 U | 3/2013 |
| CN | 203661412 U | 6/2014 |
| CN | 104754866 A | 7/2015 |
| CN | 106686884 A | 5/2017 |
| CN | 206442588 U | 8/2017 |
| JP | 2007234500 A | 9/2007 |
| JP | 2010199500 A | 9/2010 |
| KR | 20150090697 A | 8/2015 |
| WO | WO 2016047492 A1 | 3/2016 |
| WO | WO 2016052346 A1 | 4/2016 |

\* cited by examiner

FPC CONNECTOR, TOUCH-SENSITIVE SCREEN AND LCD SCREEN

CROSS-REFERENCE TO RELATED APPLICATIONS

This application is a National Application of PCT Application No. PCT/CN2018/080127 filed on Mar. 23, 2018 the entire contents of which are hereby incorporated by reference.

BACKGROUND

1. Technical Field

The present application relates to a technical field of electronic connection, and in particular, to an FPC connector, a touch-sensitive screen and an LCD screen.

2. Description of Related Art

At present, touch-sensitive screens and LCD screens have been developed toward the trend of thinning, multi-functionality and high performance.

Welded-type flexible printed circuits (FPCs) are employed in the traditional LCD screens and touch-sensitive screens. Such FPC has a PIN distance of more than 0.8 mm due to technical limitations, such that no more PINs can be accommodated within a unit width (usually 37 PINs). In this way, it's impossible for multiple interfaces to coexist, and the interfaces are easily subjected to damage during welding the FPC to a mainboard, resulting non-reusability, large waste and also inconvenience in maintenance. Obviously, it cannot meet the needs for development of the LCD screens or touch-sensitive screens.

SUMMARY

The object of the present application is to provide an FPC connector, a touch-sensitive screen and an LCD screen, for solving the problems that it's impossible for multiple interfaces to coexist, and that the interfaces are easily subjected to damage during welding the FPC to a mainboard, resulting non-reusability, large waste and also inconvenience in maintenance.

A solution as follows is adopted in the present application for solving the problems mentioned-above. An FPC connector is provided, comprising a first insulating layer, a first circuit layer and a second insulating layer, wherein the first circuit layer is located at an underside of the first insulating layer, the second insulating layer is located at an underside of the first circuit layer, the first circuit layer and the second insulating layer each has a forepart extending beyond a front end of the first insulating layer; the first circuit layer comprises a plurality of conductive strips having foreparts arranged in parallel at equal intervals, a metal layer is plated with or deposited an the foreparts of the plurality of conductive strips, the metal layer and the foreparts of the plurality of conductive strips constitute metal fingers.

The present application has the following advantages. The first insulating layer and the second insulating layer insulate and protect the first circuit layer. High routing density, lightweight, slimness, and flexibility of the first insulating layer, the first circuit layer and the second insulating layer can be achieved to meet the requirement of miniaturization, thinning, and flexibility in space allocation for electronic products. The metal layer can enhance electrical conductivity and hardness of the circuit. Coexistence of multiple interfaces can be achieved. The PFC is connected with the main board in an insetting manner, which is easier than welding, without damaging the interfaces, and leading to convenience in use, time saving and reusability.

The present application can also be improved as follows based on the above technical solution.

Further, N third insulating layers are provided between the first insulating layer and the first circuit layer, a second circuit layer comprising a plurality of conductive strips is provided on an upper side face of each third insulating layer, the plurality of conductive strips on the second circuit layer extend downward to pass through the N third insulating layers and then to correspondingly connect with the plurality of conductive strips on the first circuit layer; N forth insulating layers are provided between the second insulating layer and the first circuit layer, a third circuit layer comprising a plurality of conductive strips is provided on a lower side face of each forth insulating layer, the plurality of conductive strips on the third circuit layer extend upward as through the N forth insulating layer and then to correspondingly connect with the plurality of conductive snips on the first circuit layer; wherein N≥0.

The present application has a further advantage that high routing density, lightweight, slimness, and flexibility of the first insulating layer, the first circuit layer, the third insulating layer, the second circuit layer, the forth insulating layer, the third circuit layer and the second insulating layer can be achieved to meet the requirement of miniaturization, thinning, and flexibility in space allocation for electronic products.

Further, the conductive strips on the first circuit layer, the second circuit layer and the third circuit layer are made of gold, nickel, copper, tin, silver, aluminum or graphene.

The present application has a further advantage that materials such as gold, nickel, copper, tin, silver, aluminum or graphene are characterized by great conductivity.

Further, the third insulating layers each has first vias, each of the first vias is positioned at a place corresponding to each of the conductive strips on the second circuit layer, the plurality of conductive strips on the second circuit layer respectively pass through the corresponding first vias to connect with the plurality of conductive strips on the first circuit layer; the forth insulating layers each has second vias, each of the second vias is positioned at a place corresponding to each of the conductive strips on the third circuit layer, the plurality of conductive strips on the third circuit layer respectively pass through the corresponding second vias to connect with the plurality of conductive strips on the first circuit layer; metallic coating or deposition is performed within the first vias and the second vias.

The present application has a further advantage that the first vias and the second vias facilitate the connection of the first circuit layer respectively to the second circuit layer and the third circuit layer, such that high routing density can be achieved.

Further, a distance between two adjacent conductive strips on the first circuit layer ranges from 0.3 mm to 1.0 mm.

The present application has a further advantage that with the PIN distance decreases, more PINs can be accommodated within a unit width, so as to reserve a variety of interfaces for such as MCU, RGB, SPI, MIPI, LVDS, I2C, HDMI and USB, and meanwhile to integrate interfaces of the touch-sensitive screen and the inverter board.

Further, the first insulating layer and the second insulating layer are made of PI material or PET material.

The present application has a further advantage that materials such as PI material or PET material are characterized by good insulation.

Further, a reinforcing plate is provided at an underside of the second insulating layer, wherein the reinforcing plate is positioned corresponding to a place below the metal fingers.

The present application has a further advantage that strength of the FPC connector according to the present application can be enhanced by the reinforcing plate.

Further, the first insulating layer, the second circuit layer, the third insulating layer, the first circuit layer, the forth insulating layer, the third circuit layer, the second insulating layer and the reinforcing plate are sequentially bonded by thermosetting adhesive and hot pressing.

The present application has a further advantage that connections between the first insulating layer, the second circuit layer, the third insulating layer, the first circuit layer, the forth insulating layer, the third circuit layer, the second insulating layer and the reinforcing plate can be enhanced by the thermosetting adhesive and the hot pressing.

A further solution as follows is adopted in the present application for solving the problems mentioned-above. A touch-sensitive screen is provided, comprising an FPC connector.

According to the present application, it's advantageous that the FPC connector can be directly inserted to a connector of a circuit board rather than being welded to a mainboard, such that the touch-sensitive screen is connected to the mainboard for obtaining power and signals.

A further solution as follows is adopted in the present application for solving the problems mentioned-above. An LCD screen is provided, comprising an FPC connector.

According to the present application, it's advantageous that the FPC connector can be directly inserted to a connector of a circuit board rather than being welded to a mainboard, such that the LCD screen is connected to the mainboard for obtaining power and signals.

In the appended drawings, the parts referenced by the reference numbers are listed below:

1—first insulating layer, 2—first circuit layer, 3—second insulating layer, 4—metal layer, 5—third insulating layer, 6—forth insulating layer, 7—second circuit layer, 8—third circuit layer, 9—first via, 10—second via, 11—reinforcing plate.

DETAILED DESCRIPTION

Principles and features of the present application will be described below with reference to accompanying drawings and embodiments. It should be understood that specific embodiments described herein are merely illustrative of the present application and are not intended to limit the present application.

Figure 1:
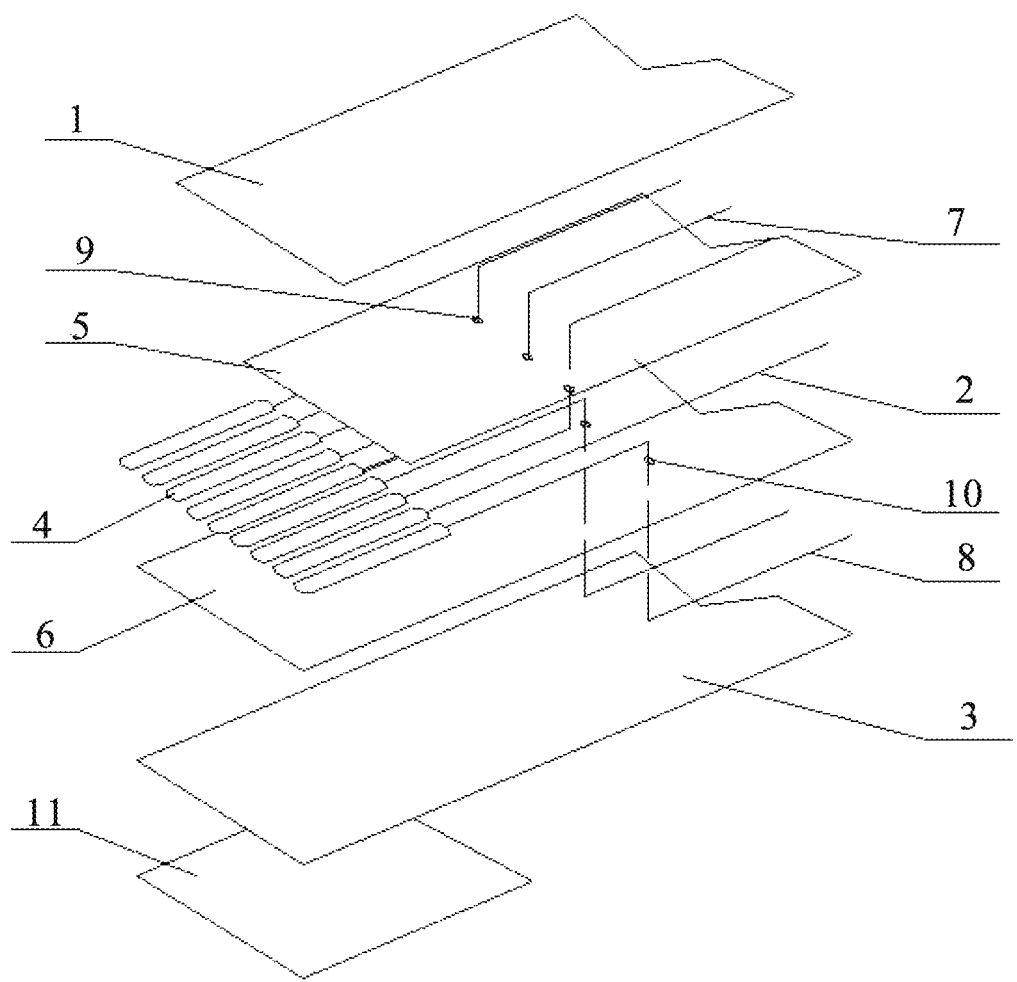
FIG. 1 schematically shows an explosive view of the structure of an FPC connector according to the present application.
Figure 2:
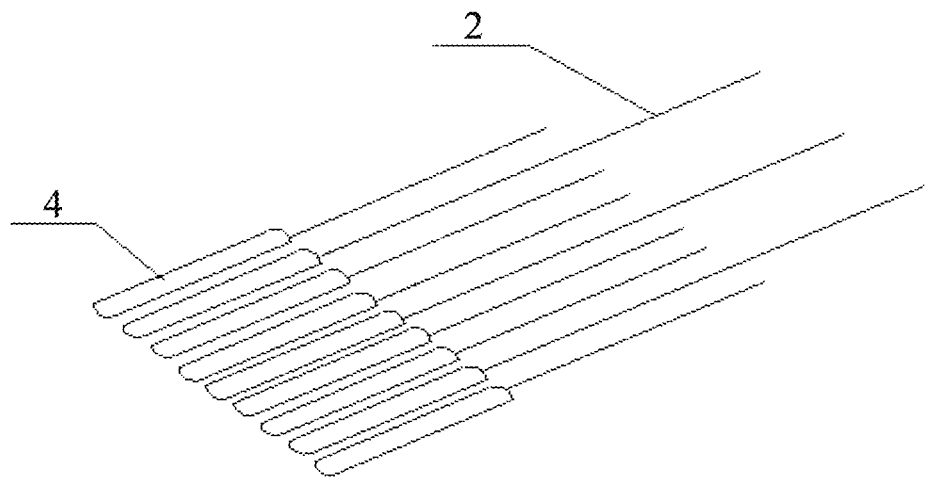
FIG. 2 schematically shows a perspective view of a plurality of conductive strips and a metal layer.
Figure 3:
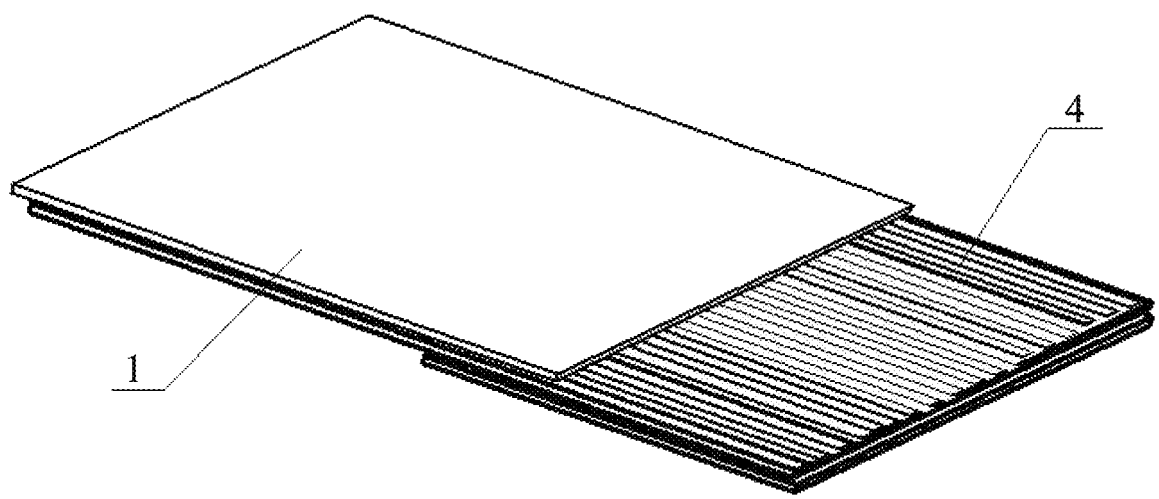
FIG. 3 schematically shows a perspective view of an FPC connector according to the present application.

As shown in FIGS. 1 to 3, an FPC connector is provided, comprising a first insulating layer 1, a first circuit layer 2 and a second insulating layer 3. The first circuit layer 2 is located at an underside of the first insulating layer 1, and the second insulating layer 3 is located at an underside of the first circuit layer 2. The first circuit layer 2 and the second insulating layer 3 each has a forepart extending beyond a front end of the first insulating layer 1. The first circuit layer 2 comprises a plurality of conductive strips having foreparts arranged in parallel at equal intervals. A metal layer 4 is plated with or deposited on the foreparts of the first circuit layer 2. The metal layer 4 and the foreparts of the first circuit layer 2 constitute metal fingers.

The first insulating layer 1 and the second insulating layer 3 insulate and protect the first circuit layer 2. High routing density lightweight, slimness, and flexibility of the first insulating layer 1, the first circuit layer 2 and the second insulating layer 3 can be achieved to meet the requirement of miniaturization, thinning, and flexibility in space allocation for electronic products. The metal layer 4 can enhance electrical conductivity and hardness of the circuit. Coexistence of multiple interfaces can be achieved. The PFC is connected with the main board in an inserting manner, which is easier than welding, without damaging the interfaces, and leading to convenience in use, time saving and reusability.

In the embodiment above, N third insulating layers 5 are provided between the first insulating layer 1 and the first circuit layer 2. A second circuit layer 7 comprising a plurality of conductive strips is provided on an upper side face of each third insulating layer 5. The plurality of conductive strips on the second circuit layer 7 extend downward to pass through the N third insulating layers 5 and then to correspondingly connect with the plurality conductive strips on the first circuit layer 2. N forth insulating layers 6 are provided between the second insulating layer 3 and the first circuit layer 2. A third circuit layer 8 comprising a plurality of conductive strips is provided on a lower side face of each forth insulating layer 6. The plurality of conductive strips on the third circuit layer 8 extend upward to pass through the N forth insulating layer 6 and then to correspondingly connect with the plurality of conductive strips on the first circuit layer 2. N is an integer which is greater than or equal to zero.

High routing density, lightweight, slimness, and flexibility of the first insulating layer 1, the first circuit layer 2, the third insulating layer 5, the second circuit layer 7, the forth insulating layer 6, the third circuit layer 8 and the second insulating layer 3 can be achieved to meet the requirement of miniaturization, thinning, and flexibility in space allocation for electronic products.

In the embodiment above, the conductive strips on the first circuit layer 2, the second circuit layer 7 and the third circuit layer 8 are made of gold, nickel, copper, tin, silver, aluminum or graphene, such materials being characterized by great conductivity.

In the embodiment above, the third insulating layers 5 each has first vias 9, each of the first vias 9 is positioned at a place corresponding to each of the conductive strips on the second circuit layer 7. The plurality of conductive strips on the second circuit layer 7 respectively pass through the corresponding first vias 9 to connect with the plurality of conductive strips on the first circuit layer 2. The forth insulating layers 6 each has second vias 10, each of the second vias 10 is positioned at a place corresponding to each of the conductive strips on the third circuit layer 8. The conductive strips on the third circuit layer 8 respectively pass through the corresponding second vias 10 to connect with the plurality of conductive strips on the first circuit layer 2. Metallic coating or deposition is performed within the first vias 9 and the second vias 10.

The first vias 9 and the second vias 10 facilitate the connection of the first circuit layer 2 respectively to the second circuit layer 7 and the third circuit layer 8, such that high routing density can be achieved. Metallic coating or deposition is performed within the vias for stability of the connection.

In the above embodiment, a distance between two adjacent conductive strips on the first circuit layer 2 ranges from 0.3 mm to 1.0 mm. With the PIN distance decreases, more PINs can be accommodated within a unit width, so as to reserve a variety of interfaces for such as MCU, RGB, SPI, MIPI, LVDS, I2C, HDMI and USB, and meanwhile to integrate interfaces of the touch-sensitive screen and the inverter board.

In the above embodiment, the first insulating layer 1 and the second insulating layer 3 are made of PI material or PET material, such materials being characterized by good insulation.

In the above embodiment, a reinforcing plate 11 is provided at an underside of the second insulating layer 3. The reinforcing plate 11 is positioned corresponding to a place below the metal fingers.

In the above embodiment, the first insulating layer 1, the second circuit layer 7, the third insulating layer 5, the first circuit layer 2, the forth insulating layer 6, the third circuit layer 8, the second insulating layer 3 and the reinforcing plate 11 are sequentially bonded by hot pressing. Connections between the first insulating layer 1, the second circuit layer 7, the third insulating layer 5, the first circuit layer 2, the forth insulating layer 6, the third circuit layer 8, the second insulating layer 3 and the reinforcing plate 11 can be enhanced by the thermosetting adhesive and the hot pressing.

Embodiment 2

A touch-sensitive screen is provided, comprising an FPC connector, wherein the FPC connector is configured to be directly inserted to a connector of a circuit board rather than being welded to a mainboard, such that the touch-sensitive screen is connected to the mainboard for obtaining power and signals.

Embodiment 3

A LCD screen is provided, comprising an FPC connector, wherein the FPC connector is configured to be directly inserted to a connector of a circuit board rather than being welded to a mainboard, such that the LCD screen is connected to the mainboard for obtaining power and signals.

Described above are only preferred embodiments of the present application, and any modifications, equivalents, improvements and the like made within the scope of the claims of the present application shall be covered by the scope of the claims of the present application.

What is claimed is:

1. An FPC connector, comprising a first insulating layer (1), a first circuit layer (2) and a second insulating layer (3), wherein the first circuit layer (2) is located at an underside of the first insulating layer (1), the second insulating layer (3) is located at an underside of the first circuit layer (2), the first circuit layer (2) and the second insulating layer (3) each has a forepart extending beyond a front end of the first insulating layer (1), the first circuit layer (2) comprises a plurality of conductive strips having foreparts arranged in parallel at equal intervals, a metal layer (4) is plated with or deposited on the foreparts of the plurality of conductive strips, the metal layer (4) and the foreparts of the plurality of conductive strips constitute metal finger;
wherein one or more of third insulating layers (5) are provided between the first insulating layer (1) and the first circuit layer (2), a second circuit layer (7) comprising a plurality of conductive strips is provided on an upper side face of each third insulating layer (5); the plurality of conductive strips on the second circuit layer (7) extend downward to pass through the third insulating layers (5) and then to correspondingly connect with the plurality of conductive strips on the first circuit layer (2); one or more of fourth insulating layers (6) are provided between the second insulating layer (3) and the first circuit layer (2), a third circuit layer (8) comprising a plurality of conductive strips is provided on a lower side face of each fourth insulating layer (6), the plurality of conductive strips on the third circuit layer (8) extend upward to pass through the fourth insulating layers (6) and then to correspondingly connect with the plurality of conductive strips on the first circuit layer (2).

2. The FPC connector according to claim 1, wherein the conductive strips on the first circuit layer (2), the second circuit layer (7) and the third circuit layer (8) are made of gold, nickel, copper, tin, silver, aluminum or graphene.

3. The FPC connector according to claim 1, wherein the third insulating layers (5) each has first vias (9), each of the first vias (9) is positioned at a place corresponding to each of the conductive strips on the second circuit layer (7), the plurality of conductive strips on the second circuit layer (7) respectively pass through the corresponding first vias (9) to connect with the plurality of conductive strips on the first circuit layer (2), the fourth insulating layers (6) each has second vias (10), each of the second vias (10) is positioned at a place corresponding to each of the conductive strips on the third circuit layer (8), the plurality of conductive strips on the third circuit layer (8) respectively pass through the corresponding second vias (10) to connect with the plurality of conductive strips on the first circuit layer (2); metallic coating or deposition is performed within the first vias (9) and the second vias (10).

4. The FPC connector according to claim 1, wherein a distance between two adjacent conductive strips on the first circuit layer (2) ranges from 0.3 mm to 1.0 mm.

5. The FPC connector according to claim 1, wherein the first insulating layer (1) and the second insulating layer (3) are made of PI material or PET material.

6. The FPC connector according to claim 1, wherein a reinforcing plate (11) is provided at an underside of the second insulating layer (3), wherein the reinforcing plate (11) is positioned right below the metal fingers.

7. The FPC connector according to claim 6, wherein the first insulating layer (1), a second circuit layer (7), a third insulating layer (5), the first circuit layer (2), a fourth insulating layer (6), a third circuit layer (8), the second insulating layer (3) and the reinforcing plate (11) are sequentially bonded by thermosetting adhesive and hot pressing.

8. A touch-sensitive screen, comprising an FPC connector, wherein the FPC connector comprises a first insulating layer (1), a first circuit layer (2) and a second insulating layer (3), the first circuit layer (2) is located at an underside of the first insulating layer (1), the second insulating layer (3) is located at an underside of the first circuit layer (2), the first circuit layer (2) and the second insulating layer (3) each has a forepart extending beyond a front end of the first insulating layer (1), the first circuit layer (2) comprises a plurality of conductive strips having foreparts arranged in parallel at equal intervals, a metal layer (4) is plated with or deposited on the foreparts of the plurality of conductive strips, the metal layer (4) and the foreparts of the plurality of conductive strips constitute metal fingers;

wherein one or more of third insulating layers (5) are provided between the first insulating layer (1) and the first circuit layer (2), a second circuit layer (7) comprising a plurality of conductive strips is provided on an upper side face of each third insulating layer (5); the plurality of conductive strips on the second circuit layer (7) extend downward to pass through the third insulating layers (5) and then to correspondingly connect with the plurality of conductive strips on the first circuit layer (2); one or more of fourth insulating layers (6) are provided between the second insulating layer (3) and the first circuit layer (2), a third circuit layer (8) comprising a plurality of conductive strips is provided on a lower side face of each fourth insulating layer (6), the plurality of conductive strips on the third circuit layer (8) extend upward to pass through the fourth insulating layers (6) and then to correspondingly connect with the plurality of conductive strips on the first circuit layer (2).

9. The touch-sensitive screen according to claim 8, wherein the third insulating layers (5) each has first vias (9), each of the first vias (9) is positioned at a place corresponding to each of the conductive strips on the second circuit layer (7), the plurality of conductive strips on the second circuit layer (7) respectively pass through the corresponding first vias (9) to connect with the plurality of conductive strips on the first circuit layer (2), the fourth insulating layers (6) each has second vias (10), each of the second vias (10) is positioned at a place corresponding to each of the conductive strips on the third circuit layer (8), the plurality of conductive strips on the third circuit layer (8) respectively pass through the corresponding second vias (10) to connect with the plurality of conductive strips on the first circuit layer (2); metallic coating or deposition is performed within the first vias (9) and the second vias (10).

10. The touch-sensitive screen according to claim 8, wherein a distance between two adjacent conductive strips on the first circuit layer (2) ranges from 0.3 mm to 1.0 mm.

11. The touch-sensitive screen according to claim 8, wherein a reinforcing plate (11) is provided at an underside of the second insulating layer (3), wherein the reinforcing plate (11) is positioned right below the metal fingers.

12. The touch-sensitive screen according to claim 11, wherein the first insulating layer (1), a second circuit layer (7), a third insulating layer (5), the first circuit layer (2), a fourth insulating layer (6), a third circuit layer (8), the second insulating layer (3) and the reinforcing plate (11) are sequentially bonded by thermosetting adhesive and hot pressing.

13. The touch-sensitive screen according to claim 8, wherein the conductive strips on the first circuit layer (2), the second circuit layer (7) and the third circuit layer (8) are made of gold, nickel, copper, tin, silver, aluminum or graphene.

14. The touch-sensitive screen according to claim 8, wherein the first insulating layer (1) and the second insulating layer (3) are made of PI material or PET material.

15. An LCD screen, comprising an FPC connector, wherein the FPC connector comprises a first insulating layer (1), a first circuit layer (2) and a second insulating layer (3), the first circuit layer (2) is located at an underside of the first insulating layer (1), the second insulating layer (3) is located at an underside of the first circuit layer (2), the first circuit layer (2) and the second insulating layer (3) each has a forepart extending beyond a front end of the first insulating layer (1), the first circuit layer (2) comprises a plurality of conductive strips having foreparts arranged in parallel at equal intervals, a metal layer (4) is plated with or deposited on the foreparts of the plurality of conductive strips, the metal layer (4) and the foreparts of the plurality of conductive strips constitute metal fingers;

wherein one or more of third insulating layers (5) are provided between the first insulating layer (1) and the first circuit layer (2), a second circuit layer (7) comprising a plurality of conductive strips is provided on an upper side face of each third insulating layer (5); the plurality of conductive strips on the second circuit layer (7) extend downward to pass through the third insulating layers (5) and then to correspondingly connect with the plurality of conductive strips on the first circuit layer (2); one or more of fourth insulating layers (6) are provided between the second insulating layer (3) and the first circuit layer (2), a third circuit layer (8) comprising a plurality of conductive strips is provided on a lower side face of each fourth insulating layer (6), the plurality of conductive strips on the third circuit layer (8) extend upward to pass through the fourth insulating layers (6) and then to correspondingly connect with the plurality of conductive strips on the first circuit layer (2).

16. The LCD screen according to claim 15, wherein the third insulating layers (5) each has first vias (9), each of the first vias (9) is positioned at a place corresponding to each of the conductive strips on the second circuit layer (7), the plurality of conductive strips on the second circuit layer (7) respectively pass through the corresponding first vias (9) to connect with the plurality of conductive strips on the first circuit layer (2), the fourth insulating layers (6) each has second vias (10), each of the second vias (10) is positioned at a place corresponding to each of the conductive strips on the third circuit layer (8), the plurality of conductive strips on the third circuit layer (8) respectively pass through the corresponding second vias (10) to connect with the plurality of conductive strips on the first circuit layer (2); metallic coating or deposition is performed within the first vias (9) and the second vias (10).

17. The LCD screen according to claim 15, wherein a distance between two adjacent conductive strips on the first circuit layer (2) ranges from 0.3 mm to 1.0 mm.

18. The LCD screen according to claim 15, wherein a reinforcing plate (11) is provided at an underside of the second insulating layer (3), wherein the reinforcing plate (11) is positioned right below the metal fingers.

19. The LCD screen according to claim 18, wherein the first insulating layer (1), a second circuit layer (7), a third insulating layer (5), the first circuit layer (2), a fourth insulating layer (6), a third circuit layer (8), the second insulating layer (3) and the reinforcing plate (11) are sequentially bonded by thermosetting adhesive and hot pressing.

20. The LCD screen according to claim 15, wherein the conductive strips on the first circuit layer (2), the second circuit layer (7) and the third circuit layer (8) are made of gold, nickel, copper, tin, silver, aluminum or graphene.

* * * * *